United States Patent
Chou et al.

(10) Patent No.: US 10,269,586 B2
(45) Date of Patent: Apr. 23, 2019

(54) PACKAGE STRUCTURE AND METHODS OF FORMING SAME

(71) Applicant: Taiwan Semiconductor Manufacturing Company, Ltd., Hsin-Chu (TW)

(72) Inventors: Bruce C. S. Chou, Hsin-Chu (TW); Chih-Hsien Lin, Tai-Chung (TW); Hsiang-Tai Lu, Zhubei (TW); Jung-Kuo Tu, Hsin-Chu (TW); Tung-Hung Hsieh, Hsin-Chu (TW); Chen-Hua Lin, Douliu (TW); Mingo Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 398 days.

(21) Appl. No.: 14/621,567

(22) Filed: Feb. 13, 2015

(65) Prior Publication Data
US 2015/0162220 A1    Jun. 11, 2015

Related U.S. Application Data

(62) Division of application No. 13/758,665, filed on Feb. 4, 2013, now Pat. No. 8,970,023.

(51) Int. Cl.
*H01L 21/56* (2006.01)
*H01L 23/00* (2006.01)
(Continued)

(52) U.S. Cl.
CPC ............ *H01L 21/56* (2013.01); *H01L 21/486* (2013.01); *H01L 21/563* (2013.01);
(Continued)

(58) Field of Classification Search
CPC ... H01L 21/56; H01L 21/76898; H01L 24/11; H01L 24/85; H01L 24/19; H01L 2224/83;
(Continued)

(56) References Cited

U.S. PATENT DOCUMENTS 6,204,562 B1    3/2001   Ho et al.
6,369,448 B1    4/2002   McCormick
(Continued)

FOREIGN PATENT DOCUMENTS

| KR | 100891537 B1 | 4/2009 |
|---|---|---|
| KR | 20100054602 A | 5/2010 |
| KR | 100961310 B1 | 6/2010 |

OTHER PUBLICATIONS

MST, Through-Silicon Vias (TSVs) with wire bonded Metal Cores), https://www.kth.se/mst/research/3d-mems/tsv-1.65663, 2010.*

*Primary Examiner* — Matthew L Reames
(74) *Attorney, Agent, or Firm* — Slater Matsil, LLP

(57) ABSTRACT

A semiconductor device includes a first die having a first active surface and a first backside surface opposite the first active surface, a second die having a second active surface and a second backside surface opposite the second active surface, and an interposer, the first active surface of the first die being electrically coupled to a first side of the interposer, the second active surface of the second die being electrically coupled to a second side of the interposer. The semiconductor device also includes a first connector over the interposer, a first encapsulating material surrounding the second die, the first encapsulating material having a first surface over the interposer, and a via electrically coupling the first connector and the interposer. A first end of the via is substantially coplanar with the first surface of the first encapsulating material.

20 Claims, 14 Drawing Sheets

(51) Int. Cl.
*H01L 25/065* (2006.01)
*H01L 25/00* (2006.01)
*H01L 23/538* (2006.01)
*H01L 21/48* (2006.01)
*H01L 21/768* (2006.01)
*H01L 23/31* (2006.01)
*H01L 23/14* (2006.01)
*H01L 23/498* (2006.01)

(52) U.S. Cl.
CPC .... *H01L 21/76898* (2013.01); *H01L 23/3135* (2013.01); *H01L 23/3185* (2013.01); *H01L 23/5389* (2013.01); *H01L 24/11* (2013.01); *H01L 24/19* (2013.01); *H01L 24/20* (2013.01); *H01L 24/73* (2013.01); *H01L 24/81* (2013.01); *H01L 24/85* (2013.01); *H01L 25/0657* (2013.01); *H01L 25/50* (2013.01); *H01L 23/147* (2013.01); *H01L 23/49811* (2013.01); *H01L 23/49827* (2013.01); *H01L 24/05* (2013.01); *H01L 24/16* (2013.01); *H01L 24/29* (2013.01); *H01L 24/32* (2013.01); *H01L 24/48* (2013.01); *H01L 24/83* (2013.01); *H01L 2224/0401* (2013.01); *H01L 2224/04105* (2013.01); *H01L 2224/12105* (2013.01); *H01L 2224/131* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13184* (2013.01); *H01L 2224/16225* (2013.01); *H01L 2224/16235* (2013.01); *H01L 2224/2101* (2013.01); *H01L 2224/214* (2013.01); *H01L 2224/215* (2013.01); *H01L 2224/2919* (2013.01); *H01L 2224/32225* (2013.01); *H01L 2224/48091* (2013.01); *H01L 2224/73204* (2013.01); *H01L 2224/73265* (2013.01); *H01L 2224/81193* (2013.01); *H01L 2224/81424* (2013.01); *H01L 2224/81444* (2013.01); *H01L 2224/81447* (2013.01); *H01L 2224/81815* (2013.01); *H01L 2224/81895* (2013.01); *H01L 2224/82101* (2013.01); *H01L 2224/83104* (2013.01); *H01L 2224/85* (2013.01); *H01L 2225/06513* (2013.01); *H01L 2924/00014* (2013.01); *H01L 2924/01322* (2013.01); *H01L 2924/12042* (2013.01); *H01L 2924/1431* (2013.01); *H01L 2924/1434* (2013.01); *H01L 2924/1531* (2013.01); *H01L 2924/15192* (2013.01); *H01L 2924/181* (2013.01); *H01L 2924/18161* (2013.01); *H01L 2924/19107* (2013.01)

(58) Field of Classification Search
CPC ............. H01L 2224/85; H01L 2224/97; H01L 2224/73265; H01L 2224/73215; H01L 2924/15311
USPC .......................................... 438/106; 257/770
See application file for complete search history.

(56) References Cited

U.S. PATENT DOCUMENTS

| | | | |
|---|---|---|---|
| 6,613,606 | B1 | 9/2003 | Lee |
| 6,774,473 | B1 | 8/2004 | Shen |
| 7,084,513 | B2 | 8/2006 | Matsuki et al. |
| 7,528,005 | B2 | 5/2009 | Takahashi et al. |
| 7,795,721 | B2 | 9/2010 | Kurita |
| 8,008,121 | B2 | 8/2011 | Choi et al. |
| 8,022,523 | B2 | 9/2011 | Chen et al. |
| 8,148,806 | B2 | 4/2012 | Lin et al. |
| 8,372,741 | B1* | 2/2013 | Co .......................... H01L 24/03 438/617 |
| 8,455,995 | B2 | 6/2013 | Tsai et al. |
| 8,525,314 | B2 | 9/2013 | Haba et al. |
| 8,642,381 | B2 | 2/2014 | Pagaila et al. |
| 8,716,859 | B2 | 5/2014 | Meyer et al. |
| 2006/0063312 | A1* | 3/2006 | Kurita ................... H01L 21/563 438/127 |
| 2006/0172456 | A1* | 8/2006 | Campbell ............... H01L 24/48 438/106 |
| 2008/0128882 | A1 | 6/2008 | Baek et al. |
| 2009/0152708 | A1 | 6/2009 | Lee et al. |
| 2009/0236752 | A1* | 9/2009 | Lee ........................ H01L 21/561 257/777 |
| 2010/0320601 | A1* | 12/2010 | Pagaila ............. H01L 21/76898 257/738 |
| 2011/0068427 | A1 | 3/2011 | Paek et al. |
| 2011/0159639 | A1* | 6/2011 | Yee ........................ H01L 21/568 438/109 |
| 2011/0254160 | A1* | 10/2011 | Tsai ....................... H01L 21/486 257/738 |
| 2011/0304999 | A1 | 12/2011 | Yu et al. |
| 2012/0056329 | A1 | 3/2012 | Pagaila et al. |
| 2012/0142184 | A1* | 6/2012 | Lin ........................ H01L 21/486 438/613 |
| 2013/0062761 | A1* | 3/2013 | Lin .................... H01L 23/49816 257/738 |
| 2014/0091471 | A1* | 4/2014 | Chen ....................... H01L 24/19 257/770 |

* cited by examiner

PACKAGE STRUCTURE AND METHODS OF FORMING SAME

This application is a divisional of U.S. patent application Ser. No. 13/758,665, filed on Feb. 4, 2013, entitled "Package Structure and Methods of Forming Same," which application is hereby incorporated herein by reference in their entireties.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

In an attempt to further increase circuit density, three-dimensional (3D) ICs have been investigated. In a typical formation process of a 3D IC, at least two dies or wafers are bonded together and electrical connections are formed between each die and contact pads on a substrate. For example, one attempt involved bonding two dies or wafers on top of each other. The stacked dies were then bonded to a packaging substrate and wire bonds or solder bumps electrically coupled contact pads on each die to contact pads on the packaging substrate.

Another 3D package utilized package-on-package (PoP) or interposer techniques for stacking dies to reduce form factor. PoP typically includes one packaged die placed over another packaged die, wherein the dies are electrically coupled by solder bumps. The bottom die is then electrically coupled to a packaging substrate. PoP packages, however, are difficult to decrease the form factor. Additionally, current techniques utilizing an interposer as the packaging substrate are limited by its still 2D-like (sometimes referred to as 2.5D) features that make it difficult to minimize the x-y dimension.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
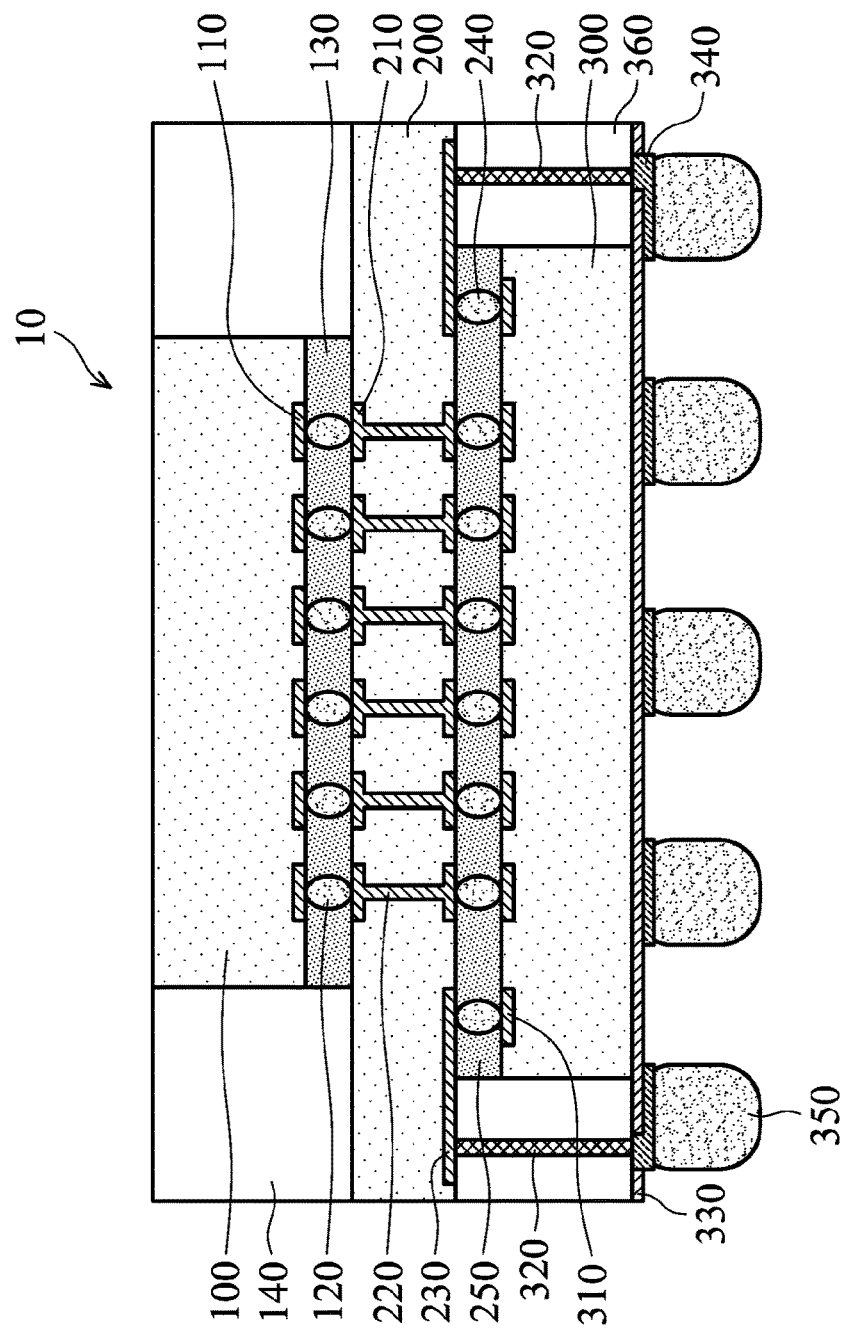
FIG. 1 illustrates a cross section of a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely wafer-level packaging comprising an interposer and double-sided die bonding to the interposer. Other embodiments may also be applied, however, to other wafer-level packages with a package substrate or with dies bonded together without package substrate or interposer.

FIG. 1 illustrates a semiconductor device 10 in accordance with various embodiments of the present disclosure. The semiconductor device 10 includes an interposer 200 with a first die 100 attached to a first side of an interposer 200 via a first set of conductive joints 120 and a second die 300 attached to a second side of the interposer 200 via a second set of conductive joints 240. The first set of conductive joints 120 and the second set of conductive joints 240 may comprise, for example, microbumps having a diameter of about 5 um to about 50 um. The semiconductor device 10 further includes vias 320 in an encapsulating material 360. The vias 320 may provide an electrical connection between the interposer 200 and a set of conductive connectors 350, which may in turn be connected to another semiconductor device, packaging substrate, or PCB board (not shown).

The interposer 200 may be formed of a semiconductor material, such as silicon, silicon germanium, silicon carbide, gallium arsenide, or other commonly used semiconductor materials. Alternatively, the interposer 200 is formed of a dielectric material, such as glass, aluminum oxide, aluminum nitride, the like, or a combination thereof. The interposer 200 is substantially free from integrated circuit devices, including active devices, such as transistors and diodes. Furthermore, the interposer 200 may include, or may be free from, passive devices, such as capacitors, resistors, inductors, varactors, the like, or a combination thereof.

Through substrate vias (TSVs) 220 and contact pads 210 in the interposer 200 provide an electrical connection between the first die 100 and the second die 300, as well as between the set of conductive connectors 350 and one or both of the first die 100 and the second die 300 by way of interconnects 230, vias 320, and redistribution layers (RDLs) 340. The set of conductive connectors 350 are coupled to the RDLs 340 with an optional dielectric layer 330 between the RDLs 340 and the second die 300 and the encapsulant 360.

The first die 100 and the second die 300 may be any suitable die for a particular application. For example, one of the first die 100 and the second die 300 may be a memory chip, such as a DRAM, SRAM, NVRAM, and/or the like, while the other die may be a logic circuit. The first die 100 includes a first set of contact pads 110 to provide an electrical connection between the first die 100 and the TSVs 220 via the first set of conductive joints 120. The second die 300 includes a second set of contact pads 310 to provide an electrical connection between the second die 300 and the TSVs 220 and the interconnects 230 via the second set of conductive joints 240.

Both the first die 100 and the second die 300 may have an underfill material (underfill 130 and 250) between the dies and the interposer 200. Also, an encapsulating material (140 and 360) may be formed over the components to protect the components from the environment and external contaminants.

Figure 2:
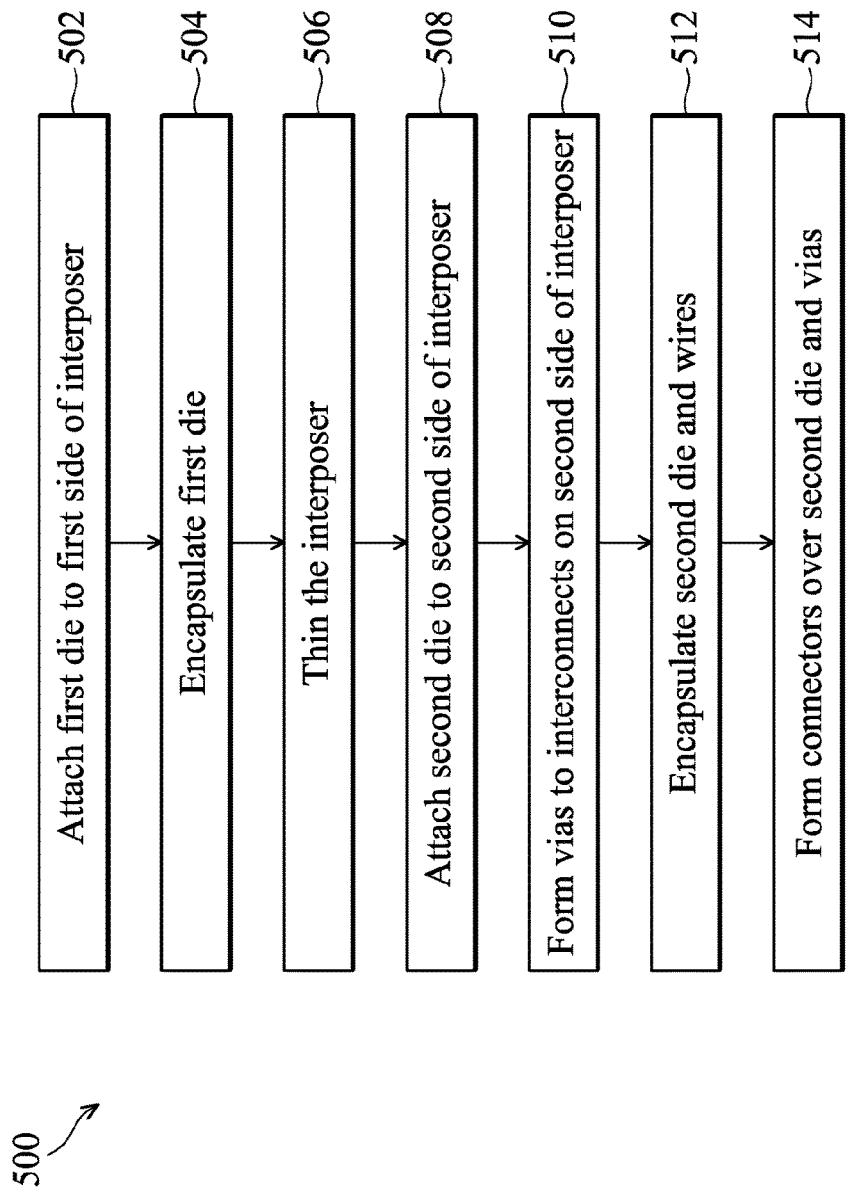
FIG. 2 illustrates a flow diagram of a method for manufacturing a semiconductor device according to an embodiment.

FIG. 2 illustrates a flow diagram of a method 500 for manufacturing a semiconductor device in accordance with an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502, the first die 100 is attached to the first side of the interposer 200. Step 502 is illustrated in FIGS. 3 and 4 as described below.

Figure 3:
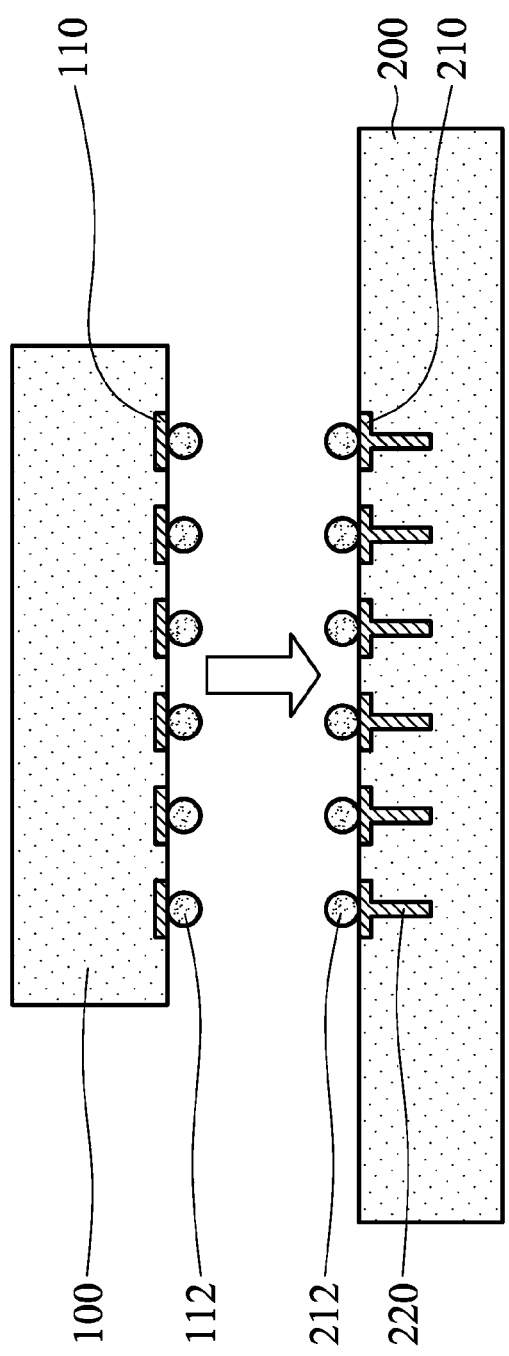
FIGS. 3 through 12 illustrate intermediate stages of forming a semiconductor device according to an embodiment.
Figure 4:
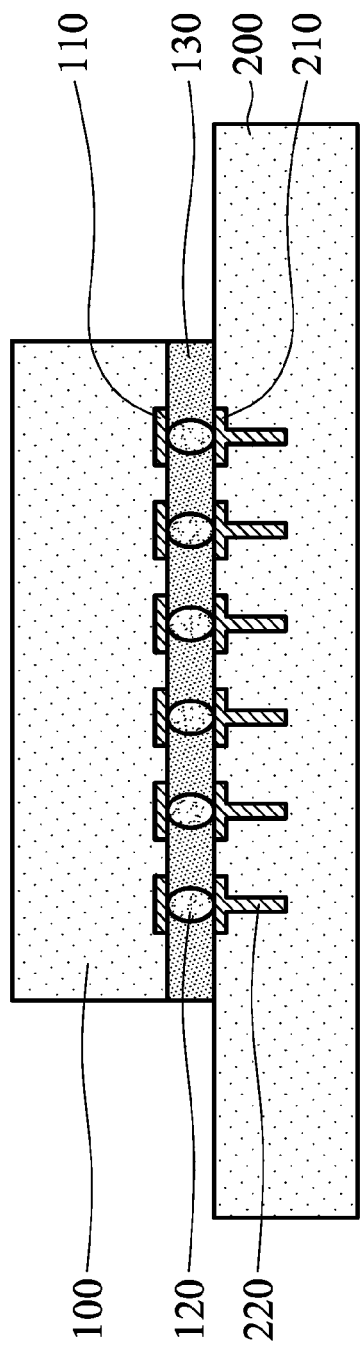

Referring to FIG. 3, an interposer 200 is shown in accordance with an embodiment. In an embodiment, the interposer 200 comprises a substrate, contact pads 210, and TSVs 220. In general, the interposer 200 is similar to the doped silicon substrate used to form a die. While interposer 200 may be formed of other materials, it is believed that using silicon substrates for the interposer may reduce the stress because the coefficient of thermal expansion (CTE) mismatch between the silicon interposers and the silicon typically used for the dies is lower than with interposers formed of different materials.

The TSVs 220, when completed in subsequent processing steps, provide electrically conductive pathways between the contact pads 210 on a first side of the interposer 200 and a second side of the interposer 200. The TSVs 220 may be formed by any appropriate method. For example, openings may be formed extending into the substrate 206 by, for example, one or more etching processes, milling, laser techniques, or the like. In an embodiment, the openings may be formed to have a depth from about 30 um to about 300 um and a width from about 3 um to about 30 um. The openings may be lined with diffusion barrier layers, adhesion layers, isolation layers, and/or the like, and filled with a conductive material. The diffusion barrier layers, for example, may comprise one or more layers of TaN, Ta, TiN, Ti, CoW, or the like, and the conductive material may comprise, for example, copper, tungsten, aluminum, silver, combinations thereof, and/or the like, formed by an electrochemical plating process, thereby forming the TSVs 220. The isolation layers, for example, may comprise SiOx, SiNx, the like, or a combination thereof.

Contact pads 210 are formed over the substrate of the interposer 200. In some embodiments, there is an interconnect structure (not shown) including one or more dielectric layers, metal lines and vias in the dielectric layers between the TSVs 220 and the contact pads 210. In some embodiments, the contact pads 210 are redistribution lines (RDLs). The contacts pads 210 may comprise aluminum, gold, copper, the like, or a combination thereof.

Next, a first set of conductive bumps 212 are formed on the first side of interposer 200 and are electrically coupled to TSVs 220 and the contact pads 210. In some embodiments, conductive bumps 212 are solder bumps, such as eutectic solder bumps. In some other embodiments, the conductive bumps 212 are copper bumps or other metal bumps formed of gold, silver, nickel, tungsten, aluminum, the like, or a combination thereof and may include a solder bump structure over a metal pillar and a barrier layer.

The first die 100 may be a device die comprising integrated circuit devices, such as transistors, capacitors, inductors, resistors (not shown), and the like, therein. Further, the first die 100 may be a logic die comprising core circuits, and may be, for example, a central processing unit (CPU) die. In some embodiments, the first die 100 may comprise multiple stacked dies like a memory stacking. The contact pads 110 on the first die 100 may be similar to the contact pads 220 as discussed above and the description will not be repeated herein. Also, a second set of conductive bumps 112 formed over the contact pads 110 may be similar to the first set of conductive bumps 212 as discussed above and the description will not be repeated herein.

An active surface of the first die 100, the active surface comprising the first set of conductive bumps 112, is bonded to the first side of the interposer 200. The bonding between the first set of conductive bumps 212 and the second set of conductive bumps 112 may be a solder bonding or a direct metal-to-metal (such as a copper-to-copper or tin-to-tin) bonding. In an embodiment, the first die 100 may be attached to the interposer by a reflow process with a temperature between about 200 C. and about 300 C. for about 10 minutes. During this reflow process, the first set of conductive bumps 112 are in contact with the second set of conductive bumps 212 to form a first set of conductive joints 120 (see FIG. 4).

FIG. 4 illustrates the first die 100 attached to the interposer 200 with the first set of conductive joints 120. In some embodiments, the conductive joints 120 may have a height between about 10 um and about 60 um. An optional underfill material 130 may be injected or otherwise formed in the space between the first die 100 and the interposer 200. The underfill material 130 may, for example, comprise a liquid epoxy, deformable gel, silicon rubber, or the like, that is dispensed between the first die 100 and the interposer 200, and then cured to harden. This underfill material 130 is used, among other things, to reduce cracking in the first set of conductive joints 120 and to protect the joints from contaminants.

At step 504, the first die 100 is encapsulated. Step 504 is illustrated in FIG. 5 as described below.

Figure 5:
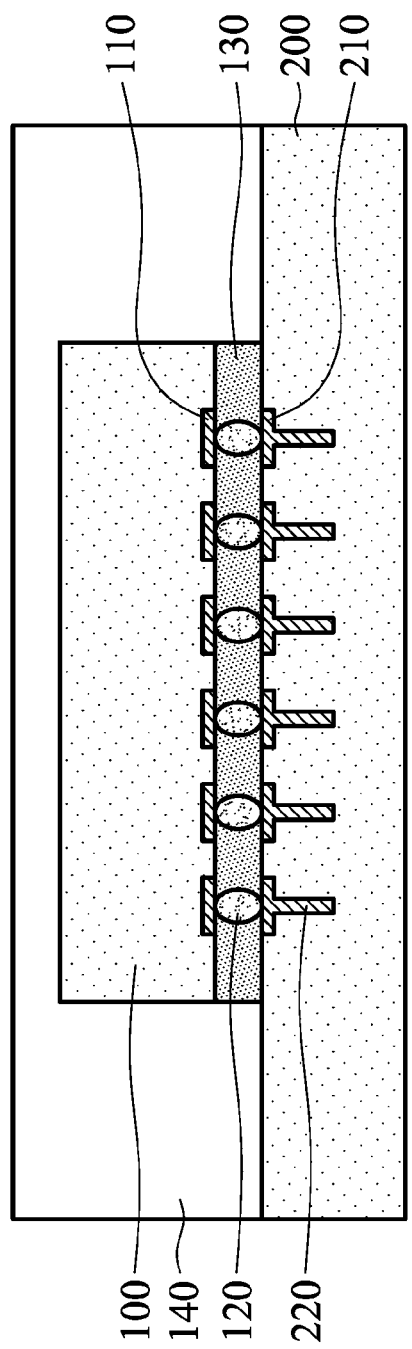

Referring to FIG. 5, a molding compound 140 (alternatively referred to as an encapsulating material) is molded onto the first die 100 and the interposer 200. The top surface of molding compound 140 may be higher than, or level with, top surfaces the first die 100. In some embodiments, the thickness of the molding compound 140 is between about 300 um and about 800 um depending on the thickness of the first die 100. In some other embodiments, the molding compound 140 and the underfill material 130 may be omitted and the first die 100 may be attached to a carrier substrate (not shown).

At step 506, the backside of interposer 200 may be thinned. Step 506 is illustrated in FIG. 6 as described below.

Figure 6:
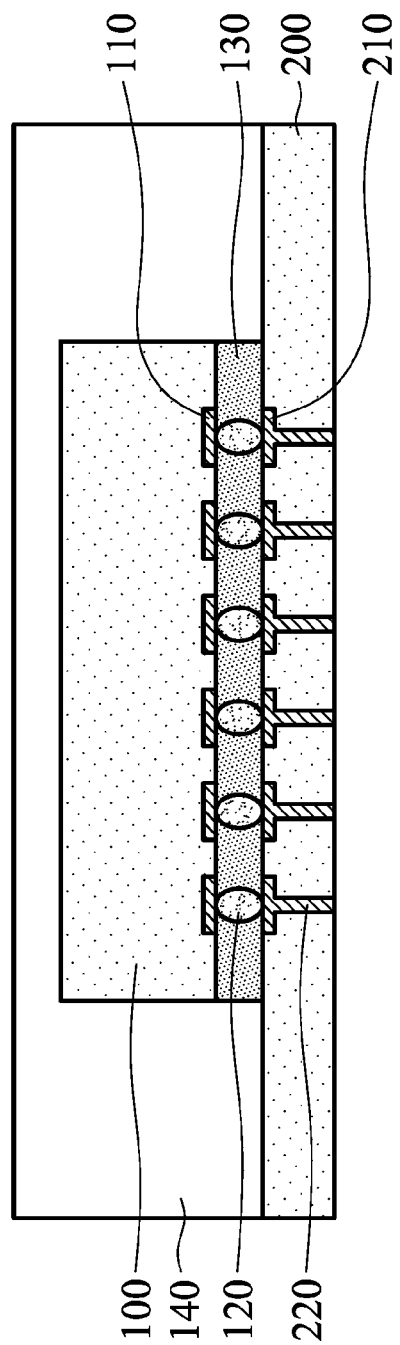
Figure 7:
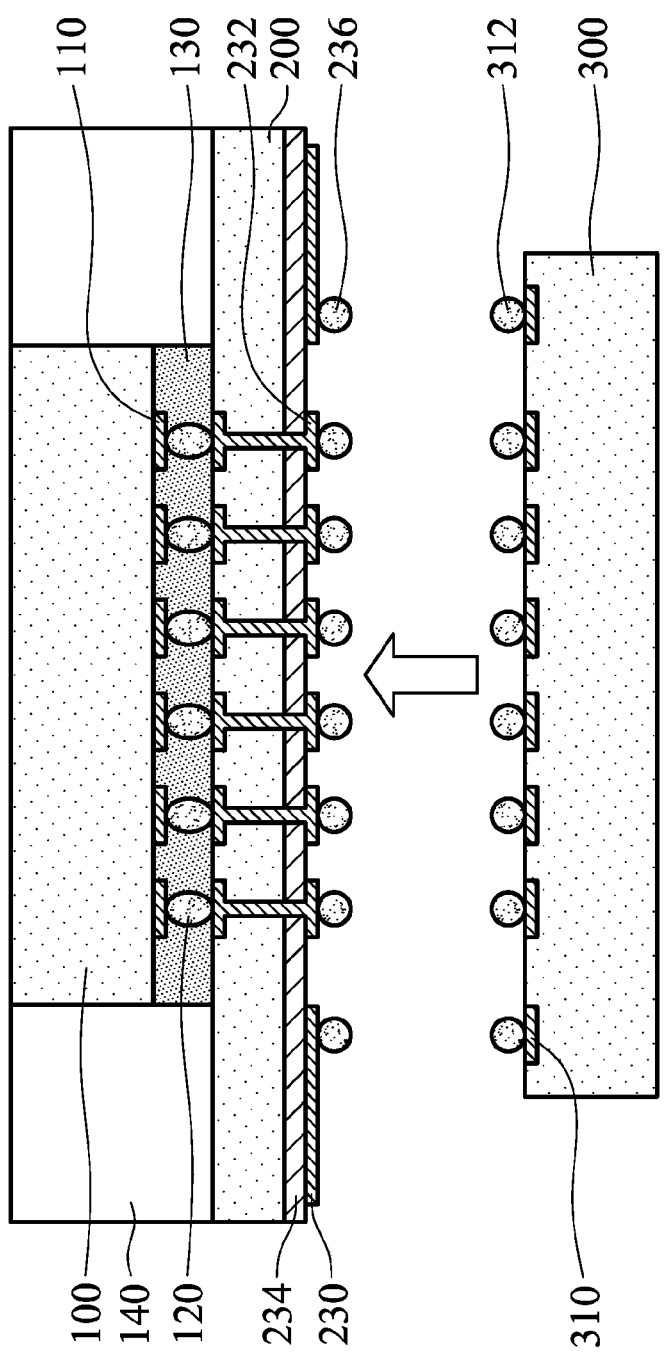

FIG. 6 illustrates performing a thinning process on a backside of the interposer 200 to expose the TSVs 220. The thinning process may be performed using an etching process and/or a planarization process, such as a chemical mechanical polishing (CMP) process. The TSVs 220 may protrude from the interposer 200 or may be substantially coplanar with the interposer 200. For example, initially a planarizing process, such as a CMP, may be performed to initially expose the liner of the through substrate vias 220. Thereafter, one or more wet etching processes having a high etch-rate selectivity between the material of the liner and the interposer 200 may be performed, thereby leaving the TSVs 220 protruding from the backside of the interposer 200 as illustrated in FIG. 7. In embodiments in which the interposer 200 comprises silicon, the etch process may be, for example, a dry etch process using $HBr/O_2$, $HBr/Cl_2/O_2$, $SF_6/CL_2$, $SF_6$ plasma, or the like.

Figure 8:
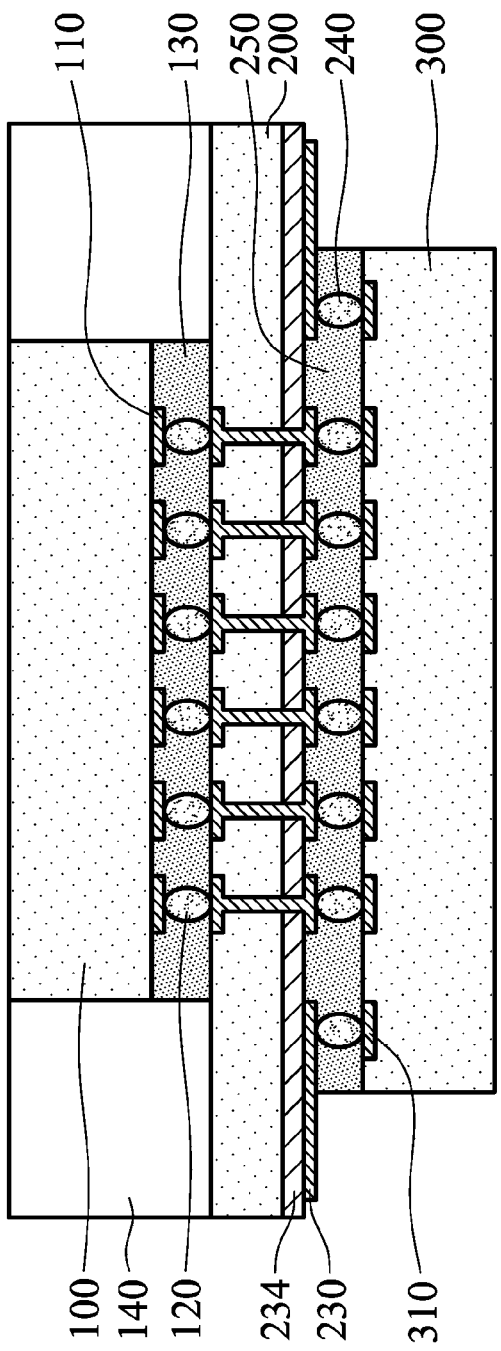

At step 508, a second die is attached to a second side of the interposer. Step 508 is illustrated in FIGS. 7 and 8 as described below.

After recessing the backside of the interposer 200, a dielectric layer 234 may formed on a second side (also referred to as a backside) of the interposer 200 as illustrated in FIG. 7, wherein the second side of the interposer 200 is opposite the first side of the interposer 200. The dielectric layer 234 may be formed on the interposer 200, wherein dielectric layer 234 may be a low-temperature polyimide layer, or may be formed of commonly known dielectric materials, such as spin-on glass, silicon oxide, silicon nitride, silicon oxynitride, the like, or a combination thereof. The dielectric layer 234 may also be formed using chemical vapor deposition (CVD). When the low-temperature polyimide is used, dielectric layer 234 may also act as a stress buffer layer.

A third set of contact pads 232 may be formed over the dielectric layer 234 and electrically coupled to the TSVs 220. In some embodiments, there may be an interconnect structure (not shown) including more dielectric layers, metal lines and vias in the dielectric layers between the TSVs 220 and the contact pads 232. In some embodiments, the contact pads 232 may be redistribution lines. The contacts pads 232 may comprise aluminum, gold, copper, the like, or a combination thereof.

A set of interconnects 230 may also be formed over the dielectric layer 234. The interconnects 230 may be similar to the third set of contact pads 232 as discussed above and the description will not be repeated herein. However, the interconnects 230 need not be the same as the contact pads 232. The interconnects 230 electrically couple the interposer 200, the first die 100, and/or the second die 300 to the subsequently formed via 320 which may then be coupled to conductive connectors 350.

Next, a third set of conductive bumps 236 are formed on the second side of interposer 200 and are electrically coupled to the TSVs 220 and the contact pads 232 and the interconnects 230. The third set of conductive bumps 236 may be similar to the first set and second set of conductive bumps 112 and 212 as discussed above and the description will not be repeated herein. However, the first, second, and third sets of conductive bumps 112, 212, and 236 need not be the same.

The second die 300 may be a device die comprising integrated circuit devices, such as transistors, capacitors, inductors, resistors (not shown), and the like, therein. The second die 300 and the first die 100 may be different types of dies. For example, the first die may be a logic die, such as a CPU die, while the second die 300 may be a memory die. In some embodiments, the second die 300 may comprise multiple stacked dies. The contact pads 310 on the second die 300 may be similar to the contact pads 220 and 232 as discussed above and the description will not be repeated herein. Also, a fourth set of conductive bumps 312 formed over the contact pads 310 may be similar to the first, second, and third sets of conductive bumps 112, 212, and 236 as discussed above and the description will not be repeated herein.

An active surface of the second die 300, the active surface comprising the third set of conductive bumps 236, is bonded to the second side of the interposer 200. The bonding between the third set of conductive bumps 236 and the fourth set of conductive bumps 312 may be a solder bonding or a direct metal-to-metal (such as a copper-to-copper) bonding. In some embodiments, the second die 300 may be attached to the interposer 200 by a reflow process with a temperature between about 200 C. and about 300 C. for about 10 minutes. During this reflow process, the third set of conductive bumps 236 are in contact with the fourth set of conductive bumps 312 to form a second set of conductive joints 240 (see FIG. 8).

FIG. 8 illustrates the second die 300 attached to the interposer 200 with the second set of conductive joints 240. In some embodiments, the conductive joints 240 may have a height between about 10 um and about 60 um. An optional underfill material 250 may be injected or otherwise formed in the space between the second die 300 and the interposer 200. The underfill material 250 may, for example, comprise a liquid epoxy, deformable gel, silicon rubber, or the like, that is dispensed between the second die 300 and the interposer 200, and then cured to harden. This underfill material 250 is used, among other things, to reduce cracking in the second set of conductive joints 240 and to protect the joints from contaminants.

At step 510, vias are formed to pads on the second side of the interposer. Step 510 is illustrated in FIG. 9 as described below.

Figure 9:
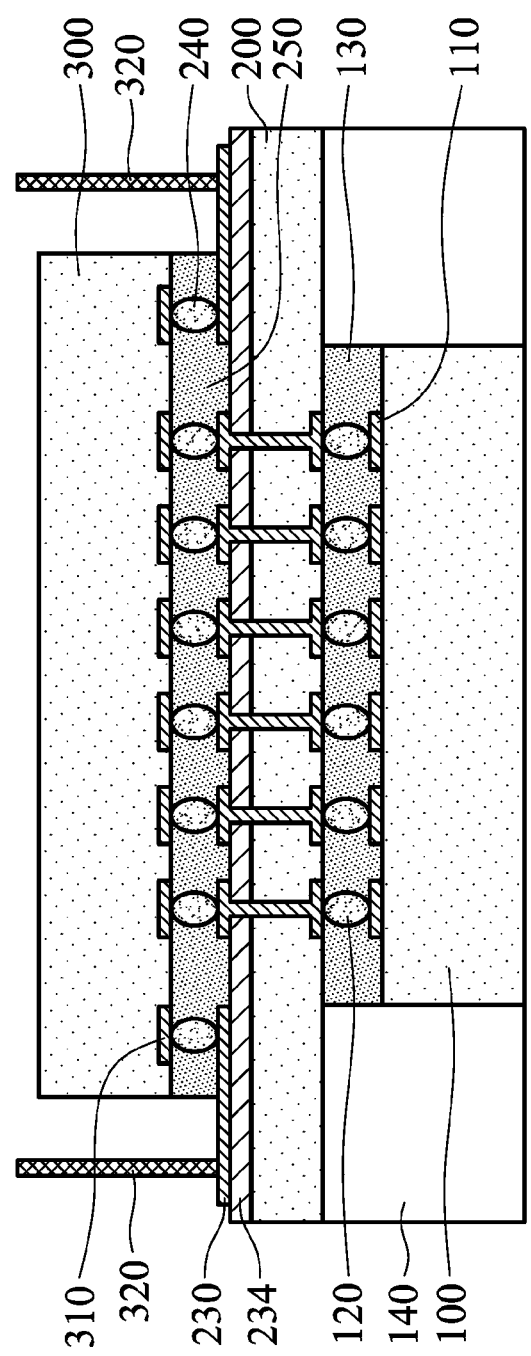

FIG. 9 illustrates forming vias 320 to the interconnects 230. The vias 320 electrically couple the interconnects 230 to the subsequently formed conductive connectors 350 (see FIG. 12). In some embodiments, the vias 320 may comprise wire bonded to the interconnects 230. The wire may comprise copper, aluminum, gold, tungsten, nickel, the like, or a combination thereof and may have a diameter between about 0.5 mil and about 3 mil. In some other embodiments, the vias 320 may be formed after the second die is encapsulated with molding compound 360 (see FIG. 11) by forming openings by a wet etch, a dry etch, laser drilling, the like, or a combination thereof in the molding compound and filling the openings with a conductive material such as copper, aluminum, gold, tungsten, nickel, the like, or a combination thereof. The top surfaces of the vias 320 may be higher than, or level with, the top surface of the second die 300.

At step 512, the second die and the vias are encapsulated. Step 512 is illustrated in FIGS. 10 and 11 as described below.

Figure 10:
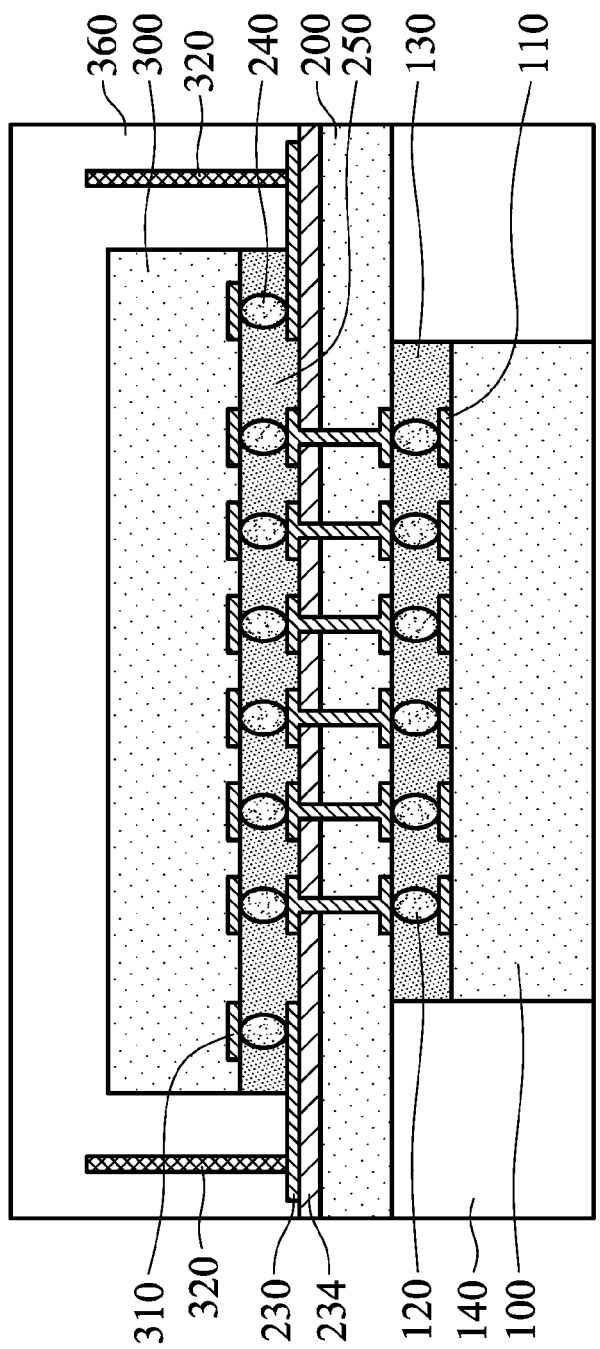

FIG. 10 illustrates the formation of a molding compound 360 (alternatively referred to as an encapsulating material) onto the second die 300, the vias 320, and the interposer 200. The top surface of molding compound 360 may be higher than, or level with, top surfaces of the second die 300 and/or the vias 320. In an embodiment, the thickness of the molding compound 360 is between about 300 um and about 800 um depending on the thickness of the second die 300 and the depth of the vias 320.

Figure 11:
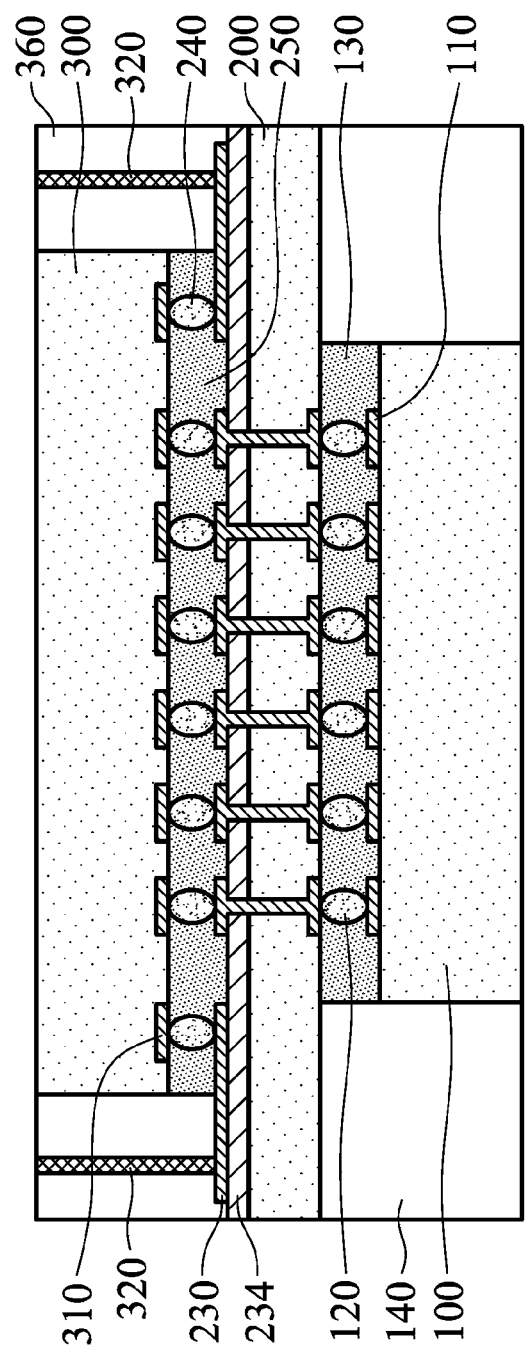

In the embodiment wherein the top surface of the molding compound 360 is higher than the top surface of the second die 300 and/or the vias 320, the top surface of the molding compound 360 may be thinned to expose the vias 320 as illustrate in FIG. 11. The thinning process may be performed using an etching process and/or a planarization process, such as a grinding process. The vias 320 may protrude from the molding compound 360 or may be substantially coplanar with the molding compound 360.

At step 514, connectors are formed over the second die and the vias. Step 514 is illustrated in FIG. 12 as described below.

Figure 12:
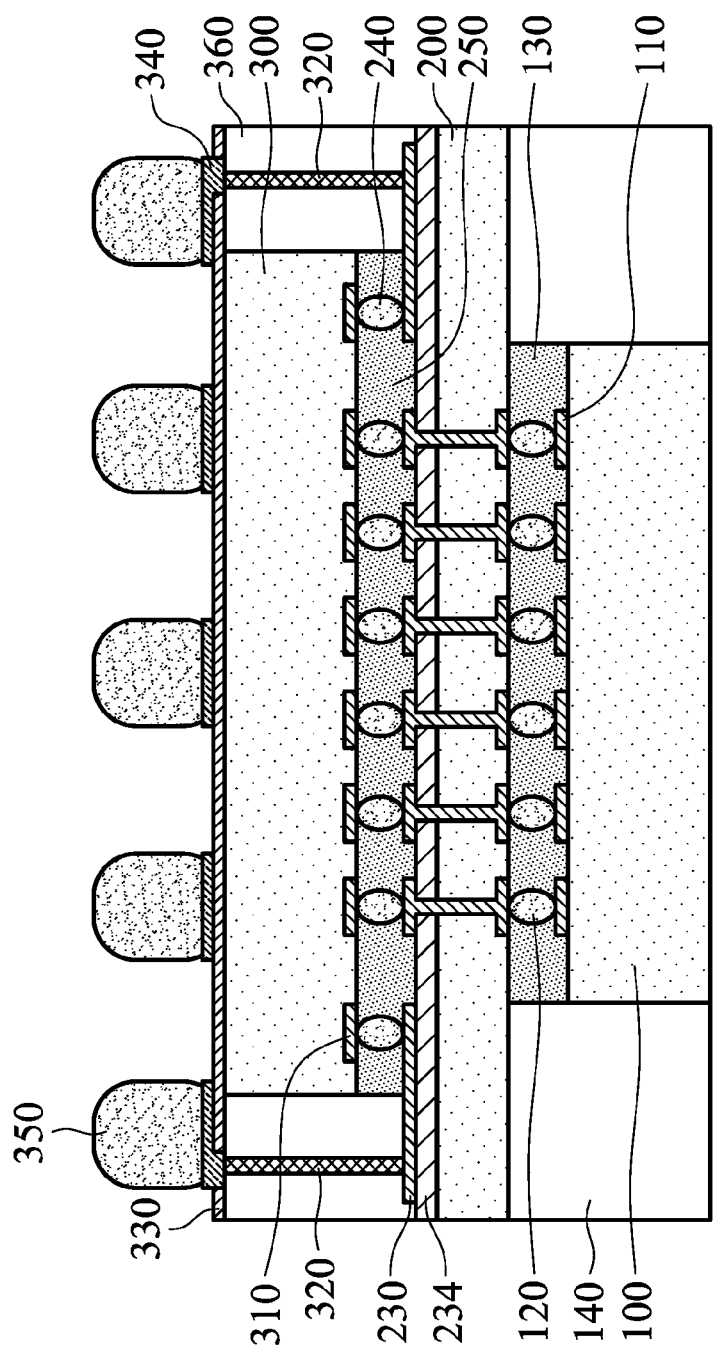

FIG. 12 illustrates the formation of the optional dielectric layer 330, the RDLs 340, and the conductive connectors 350 coupled to the RDLs 340. The optional dielectric layer 330 may be formed over the top surface of the second die 300 and the top surface of the molding compound 360. In the embodiment where the molding compound 360 is remaining over the top surface of the second die 300, the dielectric layer 330 may be omitted (see FIG. 11). The dielectric layer 330 may be omitted The dielectric layer 330 may be a low-temperature polyimide layer, or may be formed of commonly known dielectric materials, such as spin-on glass, silicon oxide, silicon nitride, silicon oxynitride, the like, or a combination thereof. The dielectric layer 330 may also be formed using CVD. When the low-temperature polyimide is used, dielectric layer 330 may also act as a stress buffer layer.

The RDLs 340 may be formed over the dielectric layer 330 and electrically coupled to the vias 320. The RDLs 340 may be formed of any suitable conductive material, such as copper, copper alloys, aluminum, silver, gold, the like, or a combination thereof formed by any suitable technique, such as electro-chemical plating (ECP), electroless plating, other deposition methods such as sputtering, printing, and CVD methods, or the like. In some embodiments, there may be an interconnect structure (not shown) including one or more dielectric layers, metal lines and vias in the dielectric layers between the RDLs 340 and the vias 320.

Next, the conductive connectors 350 may be formed over the RDLs 340 and some may be electrically coupled to the vias 320 by way of the RDLs 340. The conductive connectors 350 may be formed of a eutectic solder, lead free solder, or the like. The conductive connectors 350 may be formed by any suitable method, such as the Controlled Collapse Chip Connection (C4), ball grid array (BGA), or the like. In some embodiments, the RDLs 340 may include an under bump metallization (UBM) and the conductive connectors 350 may be formed over the UBM.

It has been found that embodiments such as those discussed above may reduce the stress between the dies and the interposer. This reduction is partially due to minimizing the CTE mismatch between the first die 100, the interposer 200, and the second die 300. Also, in the embodiments discussed above, no TSVs need to be formed in the dies so that the dies may maintain their transistor and/or diode quality and not withstand the stress of TSV formation. Further, in embodiments above, the semiconductor device does not include a packaging substrate and does not require the use of a carrier substrate during formation, which may reduce the size and cost of the device.

Figure 13:
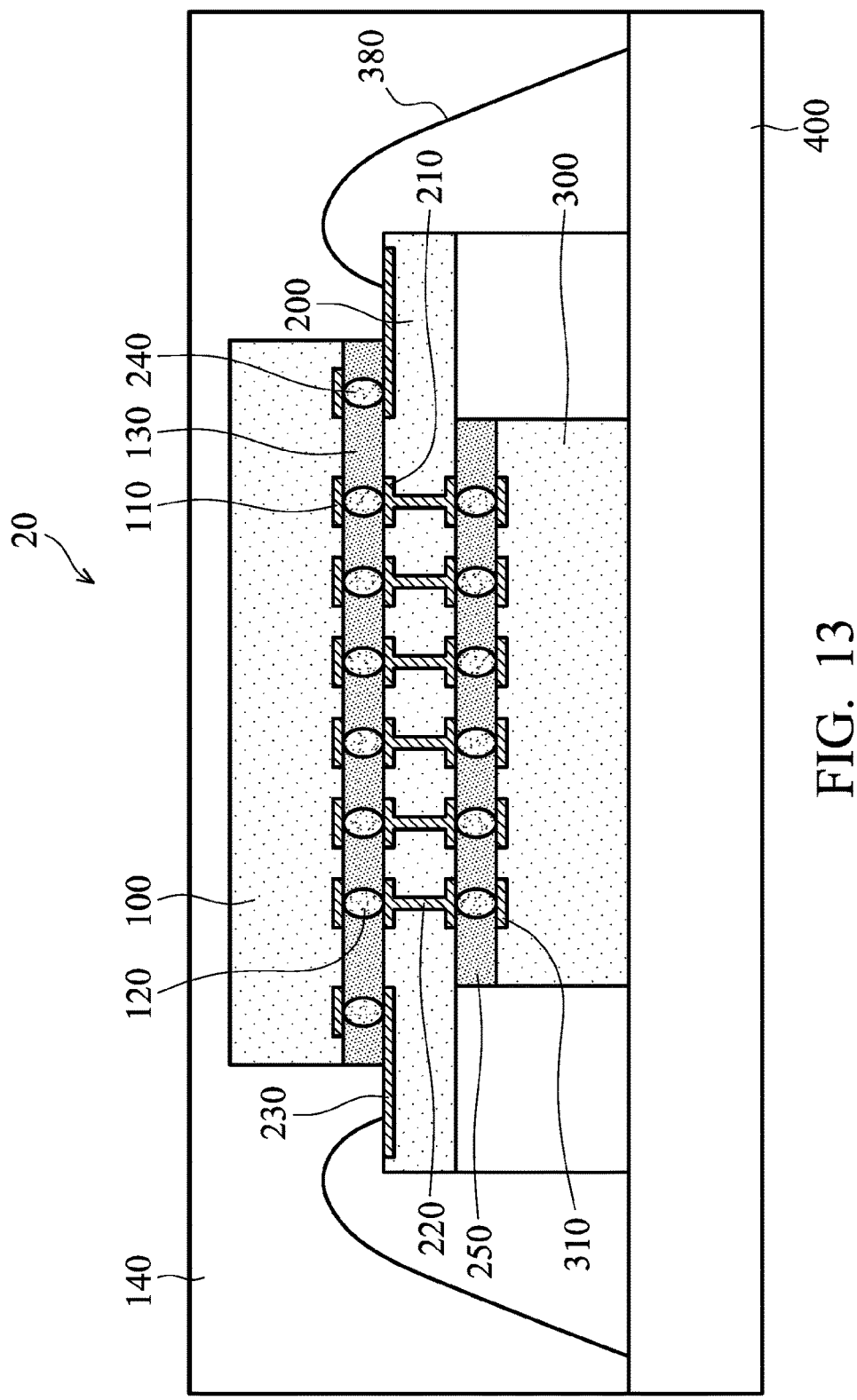
FIG. 13 illustrates a cross section of a semiconductor device according to another embodiment.

FIG. 13 illustrates a semiconductor device 20 that includes a packaging substrate 400. This embodiment is similar to the embodiment above except that the structure comprising the first die 100, the interposer 200, and the second die 300 is attached to the packaging substrate 400 and coupled to the packaging substrate 400 by wires 380. The formation of this embodiment is similar as described above except that the top surface of the second die 300 is attached to the packaging substrate and wires 380 are bonded to interconnects 230 on the interposer and the packaging substrate 400. The first die 100, the interposer 200, the second die 300, and the wires 380 are all encapsulated over the packaging substrate 400 by a molding compound 140.

Figure 14:
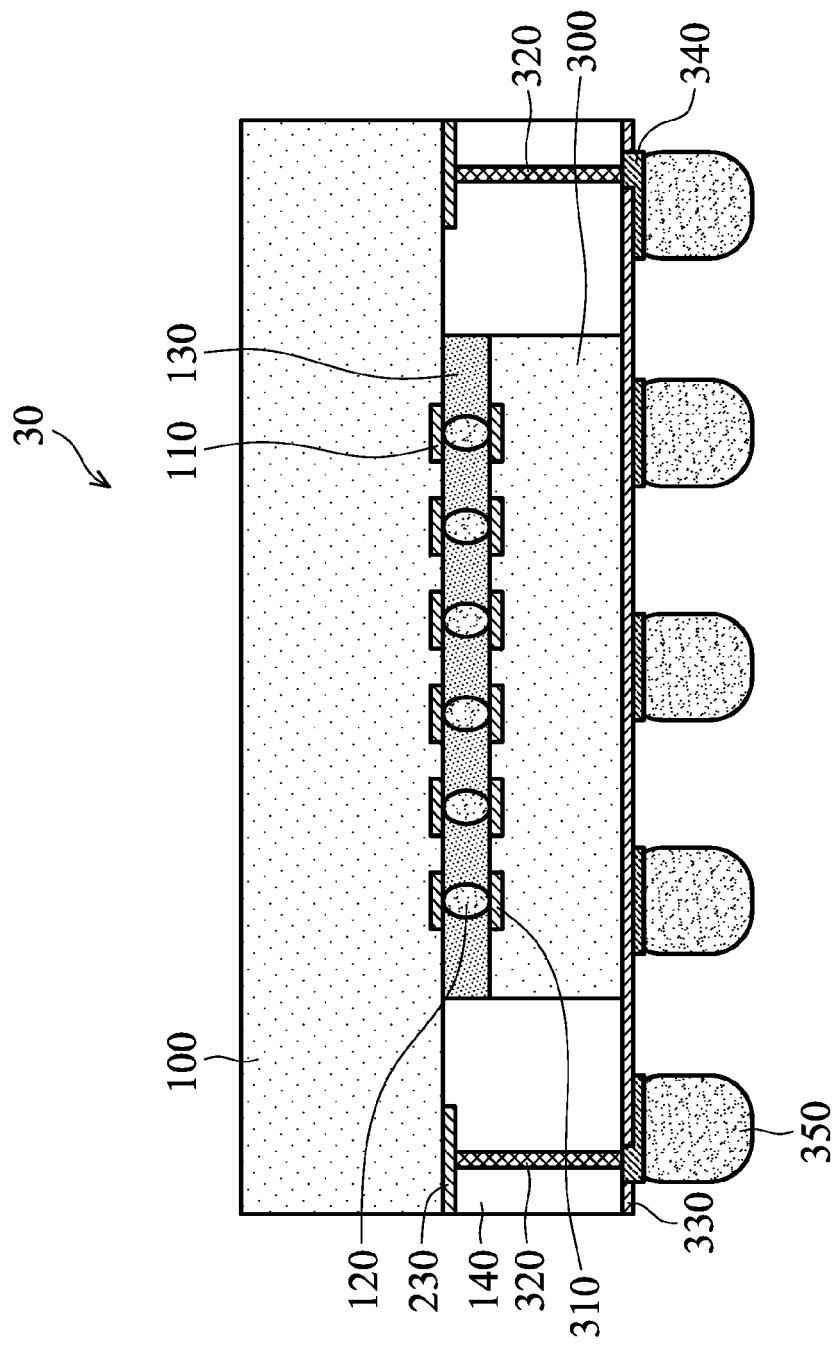
FIG. 14 illustrates a cross section of a semiconductor device according to another embodiment.

FIG. 14 illustrates a semiconductor device 30 which includes a first die 100 attached directly to a second die 300. The formation of this embodiment is similar as described above except that the first die 100 and the second die 300 are bonded directly together without an interposer between them. The bonding process may be a similar reflow process as described above forming a first set of conductive joints 120 from a first set of conductive bumps on the first die 100 and a second set of conductive bumps on the second die 300. The vias 320 electrically couple the interconnects 230 on the first die 100 to the RDLs 340 over a surface of the molding compound 140 and the second die 300.

It has been found that embodiments such as those discussed above may reduce the overall size of the semiconductor device. Also, in the embodiments discussed above, the processing steps may be reduced and the number of components may be reduced which may lower the cost of the devices.

An embodiment is a semiconductor device comprising a first die comprising a first active surface and a first backside surface opposite the first active surface, a second die comprising a second active surface and a second backside surface opposite the second active surface, and an interposer, the first active surface of the first die being electrically coupled to a first side of the interposer, the second active surface of the second die being electrically coupled to a second side of the interposer. The semiconductor device further comprises a first connector over the interposer, a first encapsulating material surrounding the second die, the first encapsulating material having a first surface over the interposer, and a via electrically coupling the first connector and the interposer. A first end of the via is substantially coplanar with the first surface of the first encapsulating material.

Another embodiment is a semiconductor device comprising a first die comprising a first surface and a second surface, the first surface comprising contact pads, the second surface being opposite the first surface, a second die comprising a third surface and a fourth surface, the third surface comprising contact pads, the fourth surface being opposite the third surface, the first surface being electrically coupled to the third surface, and an encapsulant material surrounding the second die, the encapsulant material having a surface substantially coplanar with the fourth surface. The semiconductor device further comprises a dielectric layer over the fourth surface and the surface of the encapsulant material, a plurality of connectors over the dielectric layer, and a first via in the encapsulant material, the first via electrically coupled to at least one of the plurality of connectors and to the first die.

Yet another embodiment is a method of forming a semiconductor device, the method comprising attaching a first die to a first side of an interposer, encapsulating the first die with a first encapsulant material, attaching a second die to a second side of the interposer, and encapsulating the second die with a second encapsulant material. The method further comprises forming a first via in the second encapsulant material having a first end coupled to the interposer, and forming a plurality of connectors over the second die and the second encapsulant material, at least one of the plurality of connectors coupled to a second end of the via.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a via in an interposer;
    attaching a first die to a first side of the interposer;
    encapsulating at least lateral edges of the first die with a first encapsulant material;
    recessing a second side of the interposer opposite the first side of the interposer, the recessing exposing a sidewall of the via;
    after recessing the interposer, forming a dielectric layer over the second side of the interposer, the dielectric layer directly contacting the exposed sidewall of the via, the dielectric layer comprising a first surface proximate the interposer and a second surface opposite the first surface and distal the interposer;
    after forming the dielectric layer, forming a first contact pad coupled to a first side of the via, the first contact pad directly contacting and extending along the second surface of the dielectric layer;
    after attaching the first die, attaching a second die to the second side of the interposer;
    encapsulating at least lateral edges of the second die with a second encapsulant material;
    after attaching the second die, providing a first via in the second encapsulant material having a first end coupled to the interposer; and
    forming a plurality of connectors over the second die and the second encapsulant material, at least one of the plurality of connectors coupled to a second end of the first via.

2. The method of claim 1, wherein the providing the first via further comprises:
    bonding a wire to the second side of the interposer; and
    encapsulating the wire in the second encapsulant material.

3. The method of claim 2, wherein an end of the wire is substantially coplanar with a surface of the second encapsulant material.

4. The method of claim 1 further comprising:
    forming a second contact pad coupled to a second side of the via opposite the first side of the via; and
    forming a conductive bump on the first contact pad and the second contact pad, wherein the conductive bumps, the first contact pad, the second contact pad, and the via electrically couple the first die and the second die.

5. The method of claim 1 further comprising forming a redistribution layer on the second end of the first via, the at least one of the plurality of connectors being physically coupled to the redistribution layer.

6. The method of claim 1, wherein the interposer is substantially free from active devices.

7. The method of claim 1 wherein the second encapsulant material has a surface substantially coplanar with a backside surface of the second die, and wherein a surface of the first encapsulant material is substantially coplanar with a backside surface of the first die.

8. The method of claim 1 further comprising:
    forming an underfill between the first die and the first side of the interposer; and
    forming an underfill between the second die and the second side of the interposer.

9. The method of claim 1, wherein attaching the first die to the interposer comprises bonding the first die to the interposer through direct metal-to-metal bonding.

10. The method of claim 1, wherein recessing the second side of the interposer comprises:
    planarizing the second side of the interposer to expose the via; and
    after planarizing the second side of the interposer, etching the interposer to expose the sidewall of the via.

11. A method comprising:
    forming a plurality of vias in an interposer;
    recessing a backside of the interposer such that portions of the vias protrude from the backside of the interposer;
    forming a first dielectric layer over the backside of the interposer, the first dielectric layer surrounding the protruding portions of the vias;
    forming via contact pads extending along and physically contacting a first surface of the first dielectric layer disposed furthest from the interposer, the via contact pads being connected with the vias;
    electrically coupling contact pads on a first surface of a first die to contact pads on a third surface of a second die through the interposer, the first die having the first surface and a second surface opposite the first surface, the second die having the third surface and a fourth surface opposite the third surface, the first surface of the first die and the third surface of the second die facing one another;
    encapsulating at least lateral edges of the second die with an encapsulant material;
    forming a second dielectric layer over the fourth surface and a surface of the encapsulant material;
    forming a plurality of connectors over the second dielectric layer; and
    forming a first via in the encapsulant material, the first via electrically coupled to at least one of the plurality of connectors and to the first die.

12. The method of claim 11, wherein the surface of the encapsulant material is substantially coplanar with the fourth surface.

13. The method of claim 11, wherein some of the plurality of connectors are over the second die and some of the plurality of connectors are over the encapsulant material.

14. The method of claim 11 further comprising:
forming a first set of conductive joints between the first surface and the third surface; and
forming an underfill material surrounding the first set of conductive joints between the first surface and the third surface.

15. The method of claim 11, wherein one of the first die and the second die comprises a logic circuit and the other of the first die and the second die comprises a memory.

16. A method comprising:
forming a plurality of through substrate vias through an interposer;
forming a dielectric layer over the interposer;
forming a plurality of contact pads over the through substrate vias, the contact pads comprising a plurality of first contact pads formed directly on the through substrate vias and the dielectric layer, the first contact pads extending along a surface of the dielectric layer;
electrically coupling a first active surface of a first die to a second active surface of a second die through the interposer, the first die comprising the first active surface and a first backside surface opposite the first active surface, the second die comprising the second active surface and a second backside surface opposite the second active surface;
forming an underfill extending from the second die to the interposer, the underfill extending directly between adjacent contact pads of the plurality of contact pads;
encapsulating at least lateral edges of the second die with an encapsulant material, the encapsulant material having a first surface and a second surface, the first surface being opposite the second surface;
forming a plurality of connectors over the second backside surface of the second die; and
forming a plurality of vias in the encapsulant material, each of the plurality of vias electrically coupled to at least one of the plurality of connectors, each of the plurality of vias comprising a wire bonded to an interconnect at the first surface of the encapsulant material and the at least one of the plurality of connectors at the second surface of the encapsulant material.

17. The method of claim 16, wherein the second surface of the encapsulant material is substantially coplanar with the second backside surface of the second die.

18. The method of claim 16, wherein the wire has a diameter from about 0.5 mil to about 3 mil.

19. The method of claim 11, wherein the first die, the second die, and the interposer comprise silicon (Si).

20. The method of claim 16, wherein encapsulating at least the lateral edges of the second die further comprises encapsulating at least lateral edges of the underfill with the encapsulant material.

* * * * *